United States Patent [19]

Shimada

[11] Patent Number: 4,813,046
[45] Date of Patent: Mar. 14, 1989

[54] OPTICAL SCANNING METHOD

[75] Inventor: Kazuyuki Shimada, Chofu, Japan

[73] Assignee: Ricoh Company, Ltd., Tokyo, Japan

[21] Appl. No.: 98,603

[22] Filed: Sep. 18, 1987

[30] Foreign Application Priority Data

Sep. 19, 1986 [JP] Japan .................................. 61-221507

[51] Int. Cl.[4] ............................................... H01S 3/00
[52] U.S. Cl. ........................................ 372/38; 372/33; 372/24
[58] Field of Search ..................... 372/24, 26, 28, 29, 372/33, 38

[56] References Cited

U.S. PATENT DOCUMENTS

| 3,636,250 | 1/1972 | Haeft | 372/24 |
| 4,763,334 | 8/1988 | Shimada et al. | 372/24 |

FOREIGN PATENT DOCUMENTS

| 0096341 | 12/1983 | European Pat. Off. | 372/24 |
| 0012854 | 1/1979 | Japan | 372/24 |
| 60-0174292 | 9/1985 | Japan | 372/24 |

Primary Examiner—William L. Sikes
Assistant Examiner—B. Randolph
Attorney, Agent, or Firm—Cooper & Dunham

[57] ABSTRACT

A modulated laser beam emitted from a semiconductor laser is deflected by a rotating light beam deflector to scan a surface, without using an $f\theta$ lens. The light intensity of the laser beam is set to a first reference level by a reference signal, and to a second reference level by a corrected-width control signal. Each time the frequency-dividing ratio for a reference clock signal from an oscillator is changed, a digital correction signal is produced. The gain of a D/A converter for converting the correction signal is adjusted by the corrected-width control signal which has been converted to an analog signal. The reference signal which has been converted to an analog signal is modulated by the converted correction signal to generate an analog signal which varies in a step-like manner in proportion to a change in the scanning rate. The last-mentioned analog signal is modulated by a modulating signal, and the modulated analog signal is applied to drive the semiconductor laser to optically write desired information.

3 Claims, 5 Drawing Sheets

OPTICAL SCANNING METHOD

BACKGROUND OF THE INVENTION

1. Field of the Invention

The present invention relates to an optical scanning method.

2. Description of the Prior Art

Optical scanning methods in which a modulated laser beam from a semiconductor laser is deflected by a rotating light beam deflector such as a rotating polygonal mirror or a hologram scanner are well known in the art. The laser beam is deflected by the rotating light beam deflector at a constant angular velocity to scan a desired surface. To make the scanning speed or rate constant on the surface being scanned, an fθ lens is generally employed in the optical scanning methods. Since the fθ lens is expensive, however, there has been a demand for an optical scanning system which has no such fθ lens. There has recently been proposed a polygonal mirror which does not scan a light beam at a constant angular velocity (see Japanese Patent Application No. 59(1984)-274324). No fθ lens can be used with such a proposed polygonal mirror since any fθ lens would fail to make the scanning speed constant.

One optical scanning method of optically scanning a surface without the use of an fθ lens has recently been proposed. FIG. 6 of the accompanying drawings illustrates an optical scanner used to carry out such a proposed optical scanning method. A light beam L is applied through a lens 80 to a rotating light beam deflector 82 in the form of a rotating polygonal mirror, and is reflected by one of the reflecting surfaces of the polygonal mirror 82 toward a cylindrical photoconductive photosensitive body 84 on which the laser beam is converged by the lens 80. When the polygonal mirror 82 is rotated at a constant speed about its own axis in the direction of the arrow, the laser beam reflected thereby is deflected from left to right (as shown) to scan the photosensitive body 84 along its generatrices. A light detector 86 is disposed adjacent to the photosensitive body 84 for synchronizing the points to start successive scanning cycles. Due to continued rotation of the polygonal mirror 82, the laser beam is reflected by the successive reflecting surfaces of the mirror 82 to cyclically deflect or scan the laser beam.

Assuming that a time slot required to write information of one pixel during optical scanning is T, a clock signal having a frequency fk expressed as 1/T is referred to as an image scanning clock signal. Desired information is written, one pixel by one pixel, on the photosensitive body 84 by the image scanning clock signal.

In an optial scanning method in which no fθ lens is employed, the speed at which a surface is scanned with a scanning light beam is not constant. Therefore, if the frequency fk of an image scanning clock signal were constant, the information written by the scanning light beam would be distorted. To prevent the information from being distorted, the frequency fk must be varied dependent on changes in the scanning rate at which the surface is scanned. More specifically, where the scanning rate is higher, the image scanning clock frequency fk should be increased, and where the scanning rate is lower, the image scanning clock frequency fk should be decreased.

By thus changing the image scanning clock frequency fk with the scanning rate, any distortion of the written information can effectively be reduced.

As described above, the frequency fk is a reciprocal of the time slot T that is allotted to the writing of information of one pixel. This means that when the frequency fk varies, the time slot T also varies. Insofar as the intensity of the scanning laser beam is constant, the optical energy used for writing one pixel in an area wherein the scanning rate is higher (the time slot T is shorter) is different from the optical energy used for writing one pixel in an area wherein the scanning rate is lower (the time slot T is longer). As a consequence, pixels on the photosensitive body 84 are exposed to varying amounts of light as the scanning rate changes when information is written on the photosensitive body by optical scanning, and hence the resultant information image is subject to varying image densities dependent on the changes in the scanning rate.

In view of the above problems, the inventors have proposed an optical scanning method capable of effectively reducing information image distortions image and image density variations resulting from changes in the scanning rate in an optical scanning system using no fθ lens (see Japanese Patent Application No. 60(1985)-172155).

However, semiconductor lasers used in light sources have statistical variations in their differential efficiency. In order to achieve the object of the proposed method properly, it is necessary to make adjustments according to the differential efficiency of the semiconductor laser for each optical scanning apparatus.

SUMMARY OF THE INVENTION

It is an object of the present invention to provide an optical scanning method capable of automatically and effectively reducing image density irregularities arising from changes in the scanning rate irrespective of a different differential efficiency and a time-dependent change of a semiconductor used.

According to an optical scanning method of the present invention, a semiconductor laser is used as a light source, and a modulated laser beam emitted from the semiconductor laser is deflected by a rotating light beam deflector such as a rotating polygonal mirror or a hologram scanner to scan a surface without using an fθ lens.

A digital reference signal for setting the light intensity of the laser beam from the semiconductor laser to a first reference level in an optical write scanning process is generated by a first output intensity control circuit. A digital corrected-width control signal for setting the light intensity to a second reference level is produced by a second output intensity control circuit.

An image scanning clock frequency control circuit generates an image scanning clock signal with its frequency continuously variable according to the scanning rate of main scanning on the surface being scanned. Each time the frequency-dividing ratio for a reference clock signal from an oscillator in said image scanning clock frequency control circuit is changed, an up/down counter is driven to produce a digital correction signal.

This digital correction signal is converted to an analog signal by a first D/A converter. The corrected-width control signal is converted to an analog signal by a second D/A converter. The reference signal is converted to an analog signal by a third D/A converter.

The gain of the first D/A converter is adjusted by the converted corrected-width control signal.

The converted correction signal and the converted reference signal are applied to arithmetic circuit in which the reference signal is modulated by the correction signal to generate an analog signal which varies in a step-like manner in proportion to a change in the scanning rate.

The last-mentioned analog signal is modulated by a modulating signal, and the modulated analog signal is applied to drive the semiconductor laser to optically write desired information.

FIG. 5 of the accompanying drawings shows an optical write scanning zone which is a time region in which one line is written by main scanning. Where optical write scanning is effected by a modulated light beam deflected by the rotating light beam deflector, if no $f\theta$ lens were used, the scanning rate on the surface being scanned would be as shown in FIG. 5, i.e., the scanning rate would be higher at the opposite ends of a line scanned, and would be lower at a central area of the line. Therefore, in order to prevent a recorded image from being distorted irrespective of such a change in the scanning rate, a time slot T alotted to the writing of information for one pixel must be smaller at the opposite ends of the line and larger at the central area of the line. For uniformizing the density of the recorded image in the main scanning direction under such a condition, the light intensity of the laser beam emitted from the semiconductor laser must be greater at the opposite ends of the line and smaller at the central area of the line. The light intensity at the opposite ends of the line is indicated at P(A), and the light intensity at the central area of the line is indicated at P(B).

In order to ideally uniformize the image density in the main scanning direction, the product of the time slot T and the light intensity P should be made constant regarless of the pixel position.

As is well known, the light intensity P of the semiconductor laser varies linearly with a current I which drives the semiconductor laser. Therefore, the light intensity P can be controlled by controlling the drive current I.

FIG. 4(I) shows straight lines X, Y plotted to indicate the relationship between the light intensity P and the drive current I. The gradient of the straight lines X, Y is referred to as a differential efficiency $\eta$. Differential efficiencies are not constant among semiconductor lasers of one type, but statiscally vary from semiconductor laser to semiconductor laser as shown in FIG. 4(II).

With respect to a semiconductor laser having the P-I relationship as indicated by X in FIG. 4(I), the drive current required to obtain the light intensity P(B) at the central area of the main scanning line should be $\Delta Ix$ smaller than the drive current required to achieve the light intensity P(A). For a semiconductor laer having the P-I relationship as indicated by Y, the light intensity P(B) could be achieved unless the drive current therefor were $\Delta Iy$ lower than the drive current needed to attain the light intensity P(A). According to the method disclosed in Japanese Patent Application No. 60(1985)-172155, adjustments must be made according to the differential efficiency of the semiconductor laser used in each optical scanning apparatus in order to achieve the desired light intensity P(B) at the central area of the main scanning line.

According to the method of the present invention, the light intensity P(A) is established by the reference signal, and the light intensity P(B) is established by the corrected-width control signal.

The corrected-width control signal is commensurate with the differential efficiency of the semiconductor laser used. Since the light intensity P(B) is achieved by the corrected-width control signal, the light intensity can be adjusted according to the differential efficiency.

With the optical scanning method of the present invention, distortions of a recorded image and image density irregularities can effectively be eliminated for optical scanning irrespective of the fact that no $f\theta$ lens is employed and of different differential efficiencies of various semiconductor lasers. Inasmuch as the correction signal is digitally produced, the circuit for generating the correction signal can be constructed of an inexpensive IC, and is highly reliable in operation.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 4(I) and 4(II) are graphs explaining problems to be solved by the invention;

DESCRIPTION OF THE PREFERRED EMBODIMENTS

Figure 1:
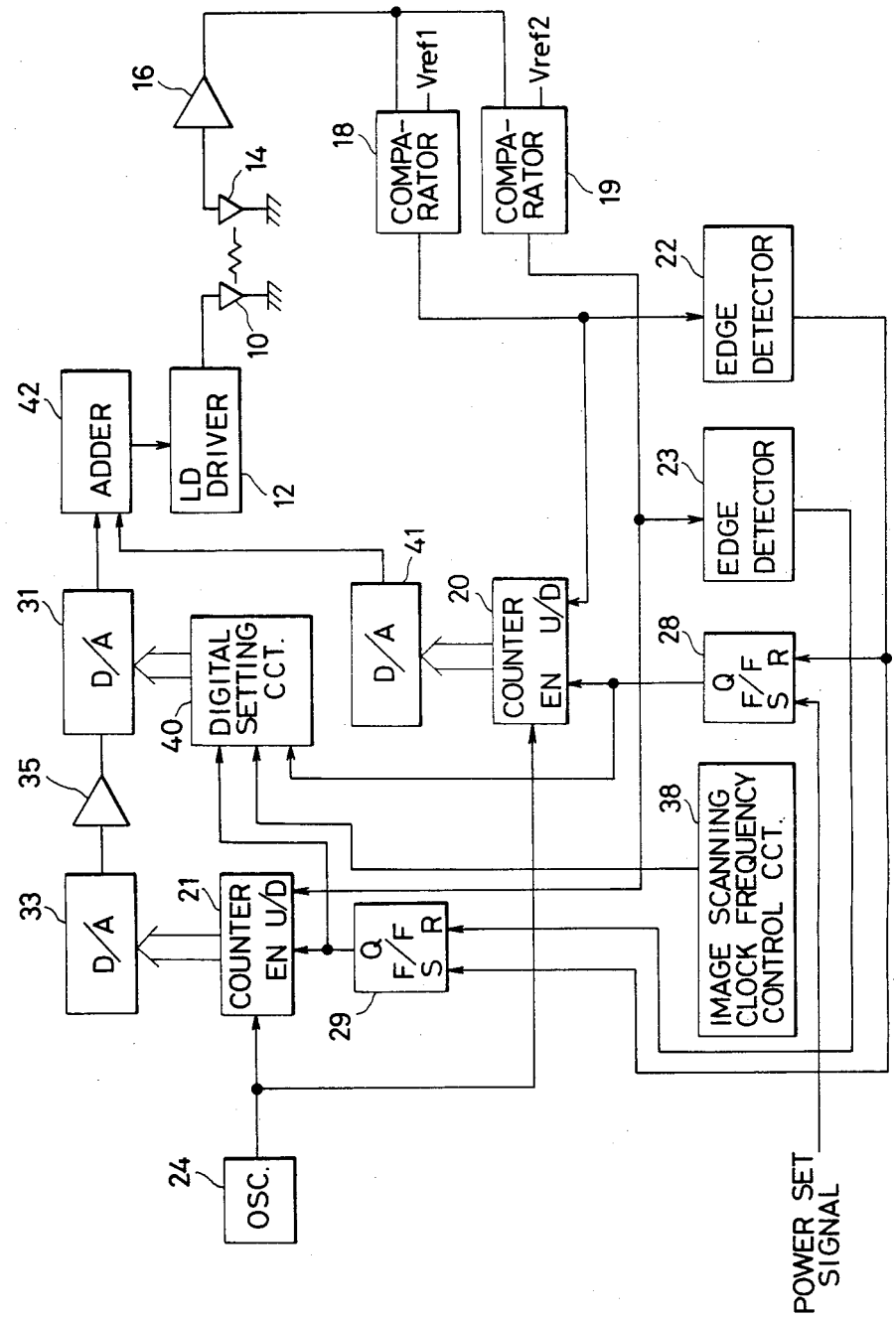
FIG. 1 is a block diagram of a circuit arrangement for carrying out an optical scanning method according to the present invention.

FIG. 1 shows a circuit arrangement for carrying out an optical scanning method according to the present invention.

Generation of a reference signal will first be described.

A reference signal is a signal necessary for achieving a light intensity level P(A) which is required to optically write data at the opposite ends of a main scanning line.

A certain drive signal (not shown) is applied to an LD driver for energizing a semiconductor laser 10, which then emits a laser beam of constant intensity in forward and rearward directions.

A laser beam emitted backwards from the semiconductor laser 10 is detected by a photosensor 14 which issues a current proportional to the intensity of the detected laser beam. The current from the photosensor 14 is converted by an amplifier 16 to a voltage which is applied as a voltage VM to comparators 18, 19, by which it is compared with reference voltages Vref1, Vref2, respectively. An output voltage from the comparator 18 is of a high level or a low level dependent on the magnitudes of the voltages VM, Vref1, for controlling the count mode an up/down counter 20. More specifically, when the output intensity of the semiconductor laser 10 does not reach a reference level P(A), the output from the comparator 18 is of a low level to control the counter 20 to operate in an up-count mode as an up counter. When VM>Vref1, the connter 20 operates in a down-count mode as a down counter.

A flip-flop 28 is set by a power set signal at the start of a standby mode to produce an output signal, which is applied to enable the counter 20 for counting up or down clock pulses generated by a clock pulse generator 24 dependent on the input mode signal from the comparator 18.

A count output from the counter 20 is converted by a third D/A converter 41 to an analog signal that is applied through an adder 42 to the LD driver 12 to change the drive signal for thereby changing the intensity of the light emitted from the semiconductor laser 10.

As the count of the counter 20 is progressively increased (or reduced), the intensity of the laser beam from the semiconductor laser 10 is also progressively increased (or reduced) to progressively increase (or reduce) the voltage VM applied to the comparator 18.

When the voltage VM is changed to the extent that its magnitude relation to the reference voltage Vref1 is reversed, the output of the comparator 18 is changed from the low level to the high level (or from the high level to the low level). At this time, an edge detector 22 detects a positive-going edge (or a negative-going edge) of the output from the comparator 18 to reset the flip-flop 28, thus disabling the counter 20. Therefore, the counter 20 holds the count at the time the output of the comparator 18 is reversed, with the result that the magnitude of the current which drives the semiconductor laser 10 at this time is maintained as it is. At this time, the voltage VM is virtually equal to the reference voltage Vref1, and the output intensity of the semiconductor laser 10 is set to a first reference level P(A) established according to the reference voltage Vref1. With the output intensity of the semiconductor laser 10 being thus set to the first reference level P(A), the digital signal produced from the counter 20 is used as a reference signal.

The edge detector 22 may be arranged to disable the counter 20 only when the output of the comparator 18 changes from the low level to the high level. With such a modification, when the output of the comparator 18 changes from the low level to the high level, the entire circuit operates in the same manner as described above. However, when the output of the comparator 18 changes from the high level to the low level, the counter 20 remains enabled and operates as an up counter. The current which drives the semiconductor laser 10 is increased, and when the output of the comparator 18 changes from the low level to the high level, the edge detector 22 detects a positive-going edge of the output of the comparator 18, thus disabling the counter 20 to hold its count.

The counter 20 may also be arranged such that it operates as a down counter when the output of the comparator 18 is of the low level, and as an up counter when the output of the comparator 18 is of the high level, with the count being in inverse proportion to the current which drives the semiconductor laser 10.

The above operation described with respect to the edge detector 22 and the counter 20 holds true for an edge detector 23 and a counter 21.

When the flip-flop 28 is reset, the counter 20 is disabled again, and a mode setting signal is applied to a digital value setting circuit 40 for setting a mode.

The photosensor 14, the amplifier 16, the comparator 18, the counter 20, the edge detector 22, the flip-flop 28, the third D/A converter 41, the adder 42, and the LD driver 12 jointly constitite a first output intensity control circuit.

The output signal from the edge detector 22 resets the flip-flop 28 as described above. At the same time, the output signal from the edge detector 22 also sets a flip-flop 29 which applies an output signal to the counter 21 to enable the same. Therefore, at the same time that the intensity of the laser beam from the semiconductor laser 10 reaches the first reference level P(A), the counter 21 counts up or down clock pulses from a clock pulse generator 24 dependent on whether the output from the comparator 19 is high or low in level.

The count output from the counter 21 is converted by a second D/A converter 33 to an analog signal which is applied through an amplifier 35, a first D/A converter 31, and the adder 42 to the LD driver 12 Thus, as the count of the counter 21 increases or decreases, the light intensity of the laser beam from the semiconductor laser 10 also increases or decreases. When the laser beam intensity reaches a second reference level P(B) established according to the reference voltage Vref2, the output signal from the comparator 19 is reversed in level, and such a level reversal is detected by the edge detector 23, which issues an output signal to reset the flip-flop 29. The counter 21 is then disabled again, and its output signal remains the same as when the second reference level P(B) is reached. The output signal from the counter 21 at this time serves as a corrected-width control signal. The photosensor 17, the comparator 19, the edge detector 23, the flip-flop 29, the counter 21, the D/A converters 33, 31, the amplifier 35, th adder 42, and the LD driver 12 jointly constitute a second output intensity control circuit.

The first and second reference levels P(A), P(B) are determined as design conditions of the optical scanning apparatus as shown in FIG. 1. However, a drive current difference ΔI which gives P(A) - P(B) varies with the differential efficiency $\eta$ of the semiconductor laser. Therefore, the magnitude of the corrected-width control signal is commensurate with the differential efficiency of the semiconductor laser 10.

The corrected-width control signal thus produced is converted by the second D/A converter 33 to an analog signal which is applied through the amplifier 35 to the first D/A converter 31 to change the gain thereof in proportion to the magnitude of the corrected-width control signal.

The reference signal and the corrected-width control signal may change each time the power of the semiconductor laser is set, but remain unchanged once the power of the semiconductor laser is set.

The generation of a correction signal will now be described.

Figure 2:
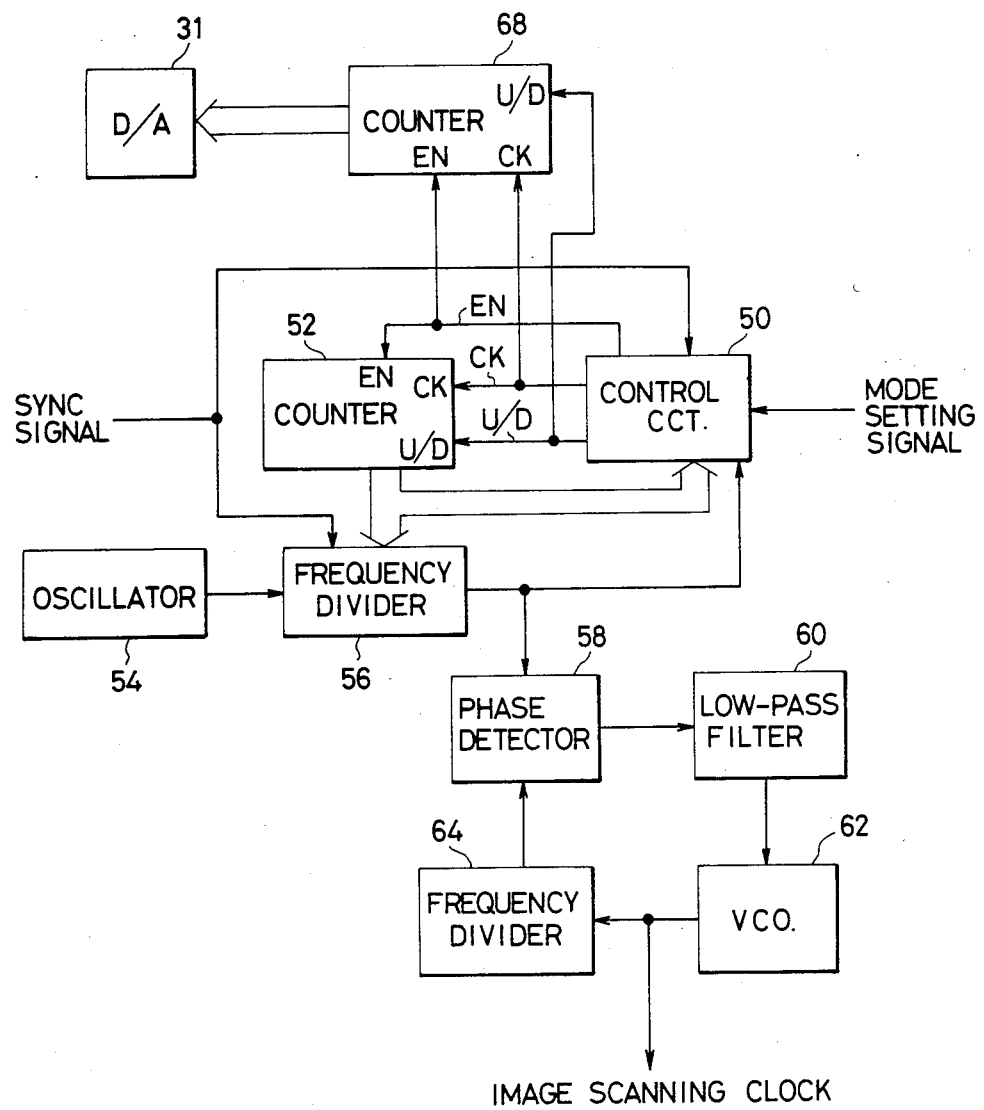
FIG. 2 is a block diagram of a circuit for generating a correction signal.

FIG. 2 shows a specific circuit arrangement of an image scanning clock frequency control circuit 38 and a digital value setting circuit 40.

Those circuits of FIG. 2 other than an up/down counter 68 and the D/A counter 31 serve as the image scanning clock frequency control circuit, which is identical to that which has been proposed by the applicant in Japanese Patent Application No. 60(1985)-92960. The image scanning clock frequency control circuit includes a phase detector 58, a low-pass filter 60, a voltage-controlled oscillator 62, and a frequency divider 64 that jointly constitute a phase-locked loop (PLL) circuit.

The portion of the image scanning clock frequency control circuit from which the PLL circuit is excluded, and the up/down counter 68 jointly constitute the digital value setting circuit 40 as shown in FIG. 1.

The image scanning clock frequency control circuit will operate as follows: A reference clock signal of a frequency $f_0$ generated by an oscillator 54 is frequency-divided by a frequency divider 56 into a position control clock signal having a frequency of $f_0/N$, which is applied to a control circuit 50 and the phase detector 58.

The phase detector 58 compares the phases of the position control clock signal and a clock signal from the frequency divider 64, and applies the phase difference as a pulse signal to the low-pass filter 60. When the phase difference information is delivered through the low-pass filter 60 to the voltage-controlled oscillator 62, the oscillator 62 produces a clock signal having a frequency commensurate with the output voltage of the low-pass filter 60. The clock signal generated by the oscillator 62 serves as an image scanning clock singal. The image scanning clock signal is then frequency-divided by the frequency divider 64, which applies the clock signal to the phase detector 58 in which it is compared with the position control clock signal.

The frequency divider 64 has a fixed frequency-dividing ratio M. When the phase difference between the clock signal applied by the frequency divider 64 to the phase detector 58 and the position control clock signal having a frequency ($f_0/N$) is not varied, the frequency $f_k$ of the image scanning clock signal produced by the voltage-controlled oscillator 62 is expressed by $f_k = f_0 \cdot (M/N)$.

By varying the frequency-dividing ratio of the frequency divider 56 from N to N1, the frequency of the position control clock signal becomes $f_0 \cdot (1/N1)$, and the frequency $f_k$ of the image scanning clock signal is changed successively at a constant rate from $f_0 \cdot (M/N)$ to $f_0 \cdot (M/N1)$.

Therefore, by successively varying the frequency-dividing ratio N of the frequency divider 56, the frequency of the image scanning clock signal can be successively changed.

The control circuit 50 produces a clock signal CK for enabling an up/down counter 52 to produce preset values for frequency-dividing ratios of the frequency divider 56, a signal EN for enabling the up/down counter 52, and a mode signal U/D for selecting an up-count or down-count mode.

The mode signal U/D is generated so that the U/D counter 52 changes from the up-count mode (or down-count mode) to the down-count mode (or up-count mode) in the vicinity of an extreme value of the scanning rate.

When the clock signal CK is applied to the counter 52, the counter 52 updates the preset value and changes the frequency-dividing ratio of the frequency divider 56 at a constant width ΔN.

An area to be optically scanned is divided into a plurality of blocks BL1, BL2, ..., BLi, ..., BLK, and numerical values Mi, ni (i=1 through K) are determined for each block BLi (i=1 through K).

In the ith block BLi, the control circuit 50 generates the clock signal CK each time Mi pulses of the position control clock signal are applied to the control circuit 50, thereby changing the frequency-dividing ratio of the frequency divider 56 by ΔN. The clock signal CK is generated ni times in the block BLi. Therefore, the block BLi corresponds to Mi ni position control clock signals.

The frequency-dividing ratio changes by ni·ΔN while the block BLi is being optically scanned.

The block number K and the values of Mi, ni are selected so that the frequency $f_k$ of the image scanning clock signal generated by the voltage-controlled oscillator 62 will well approximate an ideal frequency change arising from the variation of the scanning rate. The block number K and the values of Mi, ni are determined experimentally or theoretically according to design conditions for the optical scanning apparatus.

Figure 7:
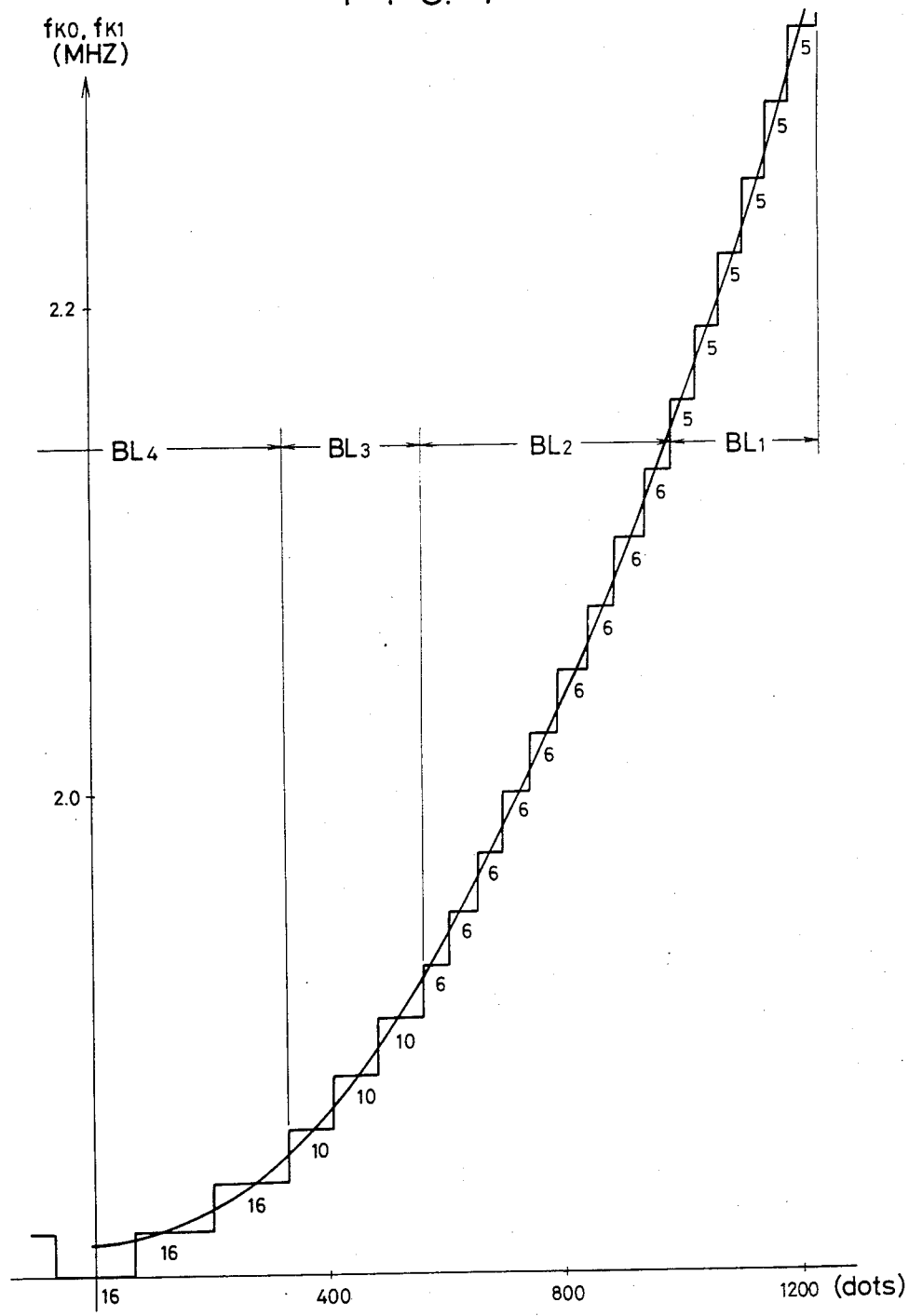
FIG. 7 is a graph showing the manner in which an image scanning clock frequency control circuit operates.

FIG. 7 shows an ideal pattern in which the image scanning clock frequency $f_{k0}$ varies and a step-like or staircase pattern in which a clock frequency $f_{k1} = (M/N) \cdot f_0$ varies by successively changing the frequency-dividing ratio (It is assumed that a special polygonal mirror proposed in Japanese Patent Application No. 59(1984)-274324 is employed. In this polygonal mirror, the deflection angle $\theta$ for a light beam applied is given by $\sin \theta = 1(A/R)\sin \alpha$ where $\alpha$ is the angle of rotation of the mirror, and A, R are constants according to the configuration of the polygonal mirror). The numerals 5, 6, 10, 16 below the step-like curve $f_{k1}$ correspond to M1, M2, M3, M4 with the righthand end of the graph being a scanning starting end. It will be noted that n1=6, n2=9, n3=3, n4=5. The graph only shows a righthand half of a symmetric step-like pattern, and the block number K is 7, M5=10, n5=3, M6=6, n6=9, M7=5, n7=6. The width ΔN for changing the frequency-dividing ration N is 1. As the frequency-dividing ratio is successively changed, the image scanning clock frequency is continuously varied to well approximate the ideal pattern in which the frequency $f_{k0}$ is changed. The frequency-dividing ratio N is 69 at the opposite ends of the scanned area and 89 at the center thereof.

Turning back to FIG. 2, the generation of the correction signal will be described. At the same time that the signals EN, CK, U/D generated by the control circuit 50 are applied to the counter 52, they are also applied to an up/down counter 68. Therefore, the counters 68, 52 are simultaneously enabled to count the clock pulses and are also simultaneously switched between the up- and down-count modes. The counter 68 is driven to count the clock pulses each time the frequency-dividing ratio for the reference clock signal from the oscillator 54 is changed in the image scanning clock frequency control circuit, and issues a digital signal that changes in a step-like manner, according to the count. This digital signal serves as the correction signal. As is apparent from the aforesaid description, the counter 68 is a substantive portion of the digital value setting circuit 40 shown in FIG. 1.

Figure 5:
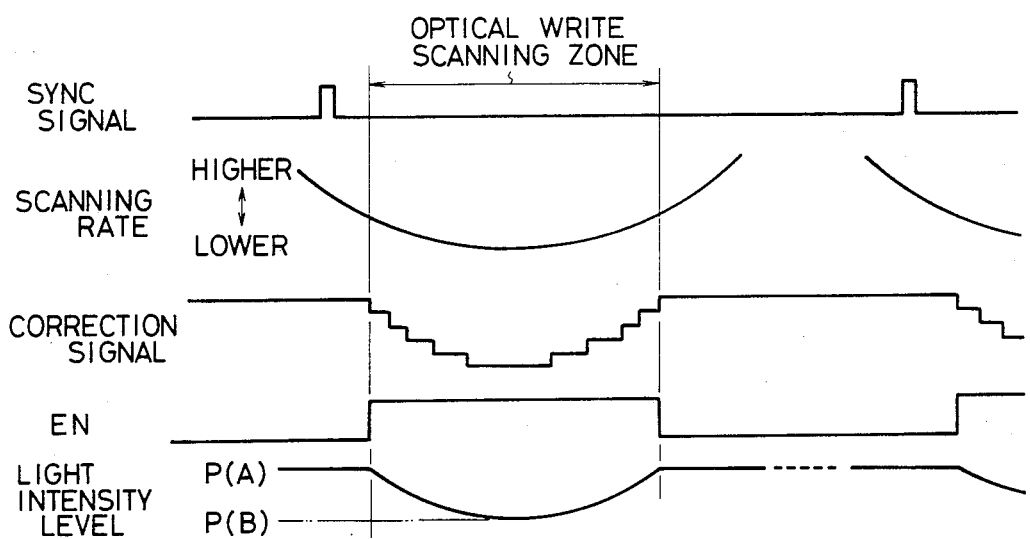
FIG. 5 is a diagram explanatory of the relationship between a scanning rate and a correction signal.
Figure 6:
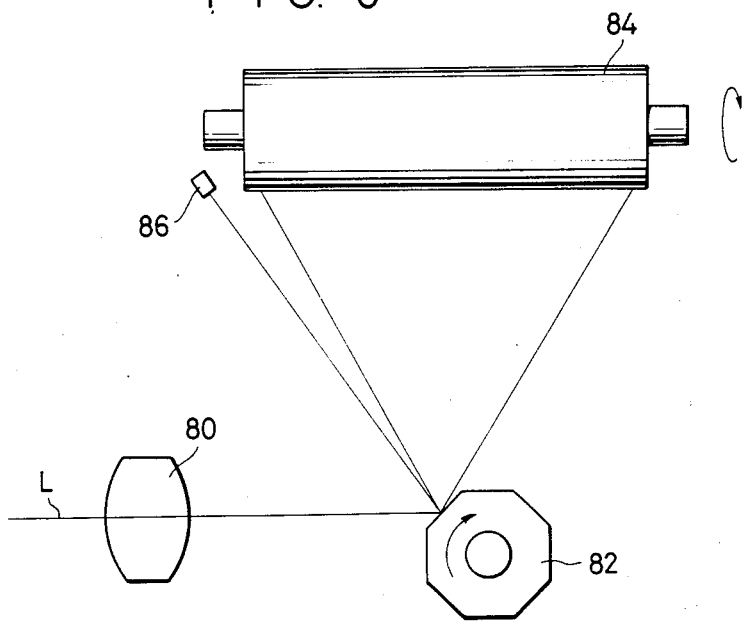
FIG. 6 is a schematic view of an optical scanning system for effecting the optical scanning method of the present invention.

Inasmuch as the counters 52, 68 simultaneously switch between the up- and down-count modes, the correction signal is larger for a higher scanning rate and smaller for a lower scanning rate, as shown in FIG. 5. The reference signal is modulated by the correction signal.

More specifically, the correction signal is converted by the first D/A converter 31 to an analog signal which modulates the reference signal in an additive manner in the adder 42.

Thus, the analog signal is produced which varies in a step-like manner in proportion to the scanning rate. By modulating the analog signal in the LD driver 12 with a modulating signal or image signal and driving the semiconductor laser 10 with the modulated signal, the intensity of the laser beam emitted from the semiconductor laser 10 is larger for a higher scanning rate, and smaller for a lower scanning rate. The laser beam intensity varies in a step-like manner. As a result, irregularities of the amount of exposure to the laser beam in the scanning direction are effectively reduced.

As can be understood from the above description, the reference signal is determined on the basis of the reference level P(A) of the light intensity of the laser beam from the semiconductor laser 10 (the light intensity at the opposite ends of the main scanning line), and the correction signal is determined according to changes in the light scanning rate. These reference signal and correction signal do not contain any information on the differential efficiency η of the semiconductor laser.

Therefore, insofar as the gain of the first D/A converter 31 is constant, the light intensity at the time of scanning a central area of the main scanning line would deviate from the prescribed intensity P(B) due to variations in η and time-dependent variations in a write scanning process. The light intensity of the laser beam emitted from the semiconductor laser would thus deviate from the desired level throughout the write scanning zone, the deviation being maximum at the central area of the main scanning line.

According to the present invention, however, the gain of the first D/A converter 31 is adjusted according to the differential efficiency η by the corrected-width control signal containing information on the differential efficiency η for thereby achieving the ligth intensity P(B) upon scanning the central area of the main scanning line. As a result, the desired light intensicy can be obtained throughout the write scanning zone.

Figure 3:
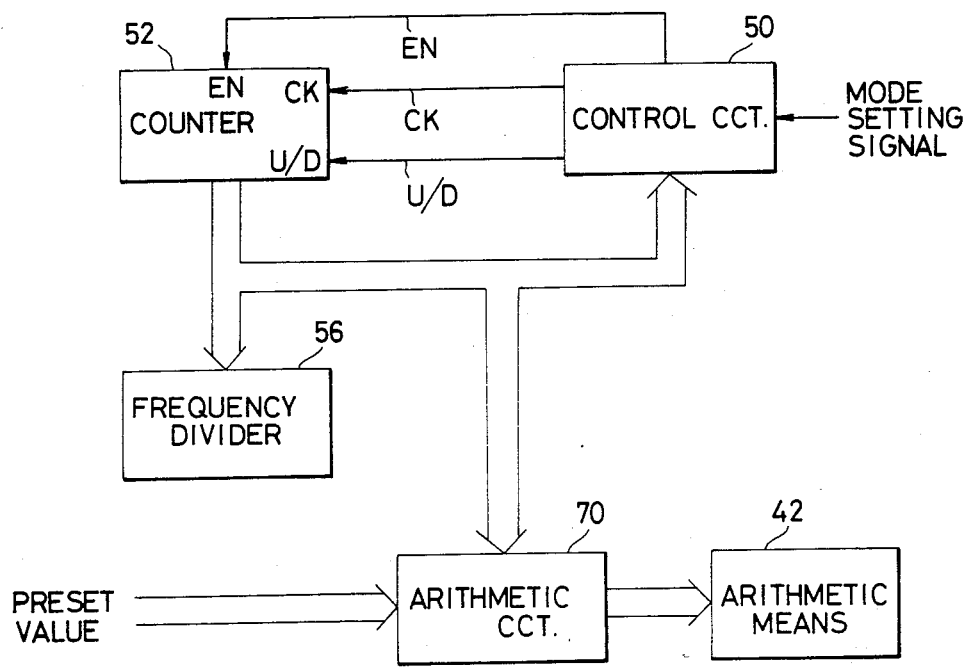
FIG. 3 is a block diagram of another circuit for generating a correction signal.
Figure 4:
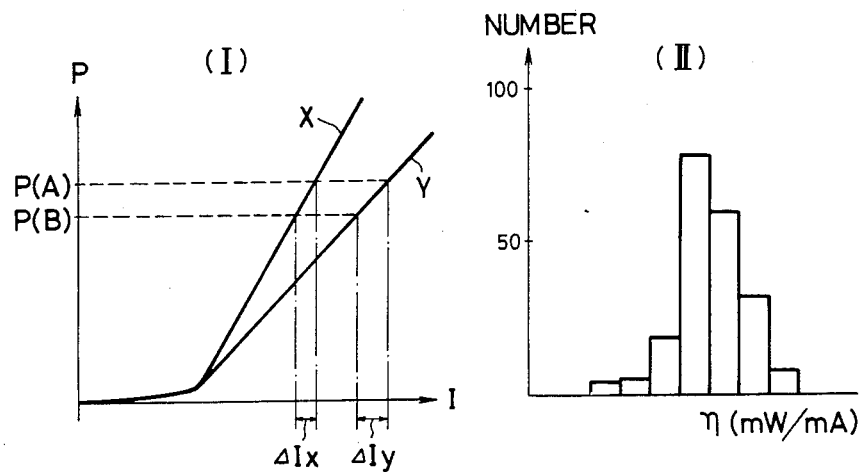

FIG. 3 illustrates another circuit arrangement for producing the correction signal. In this circuit arrangement, an output from the up/down counter 52 which is driven for successively changing the frequency-dividing ratio in a step-like manner is applied to an arithmetic circuit 70, and processed in combination with a preset value, i.e., added to or subtracted from the preset value, to produce a correction signal.

In FIGS. 2 and 3, a mode setting signal controls the digital value setting circuit 40 (FIG. 1) such that the D/A converter (31 for converting the correction signal will not act on the operation of the first and second output intensity control circuits for the semiconductor laser when setting the output intensity, and also controls the up/down counters 20, 21 such that the output from the D/A converter 41 for converting the reference signal and the D/A converter 33 for converting the corrected-width control signal will be maintained when optically scanning the photosensitive body.

The circuit for modulating the reference signal with the correction signal is not limited to the illustrated adder, but may be a subtractor, a multiplier or a divider.

Although certain preferred embodiments have been shown and described, it should be understood that many changes and modifications may be made therein without departing from the scope of the appended claim.

What is claimed is:

1. In an optical scanning system wherein a modulated light beam from a semiconductor laser is deflected by a rotating light beam deflector to scan a surface without using an fθ lens, a controlling apparatus for generating an image scanning clock signal which is variable according to the scanning rate at which said surface is scanned by said light beam and for controlling the intensity of the light beam from said semiconductor laser according to the differential efficiency of the semiconductor laser and the scanning rate, said controlling apparatus comprising:

a first output intensity control circuit operable upon power setting for obtaining a digital reference signal to set the intensity of the laser beam from the semiconductor laser during optical write scanning to a first reference level which represents the intensity of the light beam at opposite ends of a main area being scanned;

a second output intensity control circuit operable upon power setting for obtaining a digital corrected-width control signal to set the intensity of the laser beam from the semiconductor laser during optical write scanning to a second reference level which represents the intensity of the light beam at a center of the main area being scanned;

an image scanning clock frequency control circuit for generating, during optical write scanning, an image scanning clock signal having a frequency which is continuously variable according to the scanning rate at which said surface is scanned in a main scanning direction;

a digital value setting circuit for generating a digital correction signal each time the frequency-dividing ratio for a reference clock signal from an oscillator in said image scanning clock frequency control circuit is changed;

a first D/A converter for converting the correction signal from said digital value setting circuit into an analog signal;

a second D/A converter for converting the corrected-width control signal from said second output intensity control circuit into an analog signal during optical write scanning;

a third D/A converter for converting the reference signal from said first output intensity control circuit into an analog signal during optical write scanning;

the arrangement being such that the gain of said first D/A converter will be adjusted according to the corrected-width control signal by the output signal from said second D/A converter.

2. An optical scanning system comprising a surface, a laser which generates a light beam for writing along scan lines on said surface, wherein said light beam can be modulated with image information, a light beam deflector which scans said light beam along said scan lines without using an fθ lens, and a controlling apparatus comprising:

a first control circuit responsive to the intensity of said laser beam at end points which are at opposite sides of a scan line and to a first reference level to generate a first digital control signal related to a comparison between said intensity at said end points and said first reference level;

a second control circuit responsive to the intensity of said laser beam at a central point of a scan line and to a second reference level to generate a second digital control signal related to a comparison between said intensity at said central point and said second reference level;

a clock circuit which generates writing clock intervals at a frequency which varies with the speed at which said light beam scans along a scan line;

a digital value setting circuit which generates a digital correction signal as a function of selected changes of said frequency of said writing clock intervals;

a first D/A converter for converting the correction signal from said digital value setting circuit into a first analog signal, said first D/A converter having controllable gain;

a second D/A converter for converting said second digital control signal from said second control circuit into a second analog signal, and a circuit for controlling the gain of said first D/A converter in accordance with said second analog signal, to thereby cause said first analog signal to take into account the comparisons of said intensity at the end points and at the central point with said first and second reference levels;

a third D/A converter for converting said first digital control signal from said first control circuit into a third analog signal; and a combining circuit which combines said first and third analog signals to produce a combined control signal and a driving circuit which drives said laser in accordance with said combined control signal to thereby equalize the light energy of said light beam, when not modulated by image information, as between different writing intervals.

3. A laser beam image writing system comprising:

a surface, a laser which generates a laser beam for writing along scan lines at said surface, wherein said laser beam can be modulated with image information, and a deflector for scanning said light beam along said surface such that the beam speed along a scan line is high at the ends but low at the center of a scan line;

a clock circuit generating writing clock intervals at a clock rate which varies with the speed of the light beam along a scan line; and an intensity control circuit which controls the intensity of said laser beam as a function of both the speed of said light beam along a scan line and the intensity of said light beam at points at the ends and at the center of a scan line to reduce variations between the intensity of said light beam as between said writing clock intervals when said beam is not modulated by image information.

* * * * *